(12) United States Patent
Miyazawa et al.

(10) Patent No.: US 8,534,802 B2
(45) Date of Patent: Sep. 17, 2013

(54) LIQUID EJECTING HEAD, LIQUID EJECTING APPARATUS AND ACTUATOR DEVICE

(75) Inventors: Hiromu Miyazawa, Azumino (JP); Hiroshi Ito, Suwa (JP); Koichi Morozumi, Shiojiri (JP); Jiro Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 495 days.

(21) Appl. No.: 12/562,306

(22) Filed: Sep. 18, 2009

(65) Prior Publication Data
US 2010/0073435 A1 Mar. 25, 2010

(30) Foreign Application Priority Data

Sep. 19, 2008 (JP) ................................ 2008-240389
Jul. 6, 2009 (JP) ................................ 2009-159556

(51) Int. Cl.
*B41J 2/045* (2006.01)
(52) U.S. Cl.
USPC .......................................................... 347/68
(58) Field of Classification Search
None
See application file for complete search history.

(56) References Cited

U.S. PATENT DOCUMENTS
2008/0203856 A1* 8/2008 Miyazawa .................... 310/358

FOREIGN PATENT DOCUMENTS
JP 2003-127366 5/2003

OTHER PUBLICATIONS
Liu, Hong Mei, et al., "Electromechanical Properties of Microcantilever Actuated by Enhanced Piezoelectric PZT Thick Film", Chin. Phys. Lett, vol. 25, No. 11 (2008), 4128.*

* cited by examiner

*Primary Examiner* — Matthew Luu
*Assistant Examiner* — Erica Lin
(74) *Attorney, Agent, or Firm* — Workman Nydegger

(57) ABSTRACT

A liquid ejecting head including a fluid channel forming substrate including a pressure generating chamber communicating with a nozzle opening that ejects a liquid droplet and a piezoelectric element. The piezoelectric element has a first electrode, a piezoelectric material layer that is provided on the first electrode and has a perovskite monoclinic structure, and a second electrode formed on the piezoelectric material layer opposite to the first electrode. An angle formed between a direction of an electric field generated between the first and second electrodes and an orientation of a polarization moment of the piezoelectric material layer is greater than an angle formed between the direction of the electric field at a time when the piezoelectric constant of the piezoelectric material layer reaches a maximum level and the orientation of the polarization moment.

16 Claims, 13 Drawing Sheets

LIQUID EJECTING HEAD, LIQUID EJECTING APPARATUS AND ACTUATOR DEVICE

The entire disclosure of Japanese Patent Application Nos. 2008-240389, filed Sep. 19, 2008 and 2009-159556, filed Jul. 6, 2009 are expressly incorporated herein by reference.

BACKGROUND OF THE INVENTION

1. Technical Field

The present invention relates to a liquid ejecting head. More specifically, the present invention relates to a liquid ejecting head that ejects liquid through a nozzle opening, a liquid ejecting apparatus, and an actuator device.

2. Related Art

In some of piezoelectric elements currently used in liquid ejecting heads, a piezoelectric material layer made of a piezoelectric material exhibiting an electromechanical transducing function such as, for example, a crystalline dielectric material, is disposed between two electrodes. An example a liquid ejecting head which uses such an actuator is an ink jet recording head which has a pressure generating chamber communicating with a nozzle opening that ejects an ink droplet. A part of the pressure generating chamber is constituted by a diaphragm and the diaphragm is deformed by a piezoelectric element, so as to pressurize ink in the pressure generating chamber and to eject an ink droplet through the nozzle opening. The use of piezoelectric elements in ink jet recording heads is known in the art. In such a piezoelectric element, for example, a piezoelectric material layer is uniformly formed over an entire surface of a diaphragm by using a film forming technology. The piezoelectric material layer is cut to be divided into parts having a shape corresponding to a pressure generating chamber so as to form independent piezoelectric elements for the respective pressure generating chambers using a lithography method. One example of such a configuration is disclosed in JP-A-2003-127366 at pages 4 to 7 and in FIGS. 1 to 4.

One problem with this configuration, however, is that since the piezoelectric material forming the piezoelectric material layer repeatedly undergoes rotational expansion and contraction of polarization during its operation, a so-called wear phenomenon may occur where the orientation of the polarization becomes partially fixed so as to follow an electric field application direction as time passes, resulting in the decrease in the piezoelectric displacement amount. In a case where such a piezoelectric element is used, for example, in a liquid ejecting head, the piezoelectric displacement amount varies in accordance with the use of the liquid ejecting head so that it is difficult to perform stable ejecting of the liquid.

The above problem arises not only in an actuator device used in an ink jet recording head and other liquid ejecting heads but also in an actuator device mounted in other types of devices.

BRIEF SUMMARY OF THE INVENTION

An advantage of some aspects of the invention is that it provides a liquid ejecting head whose durability can be improved by reducing a degree of change of a displacement amount due to repeated operation, and it provides a liquid ejecting apparatus and an actuator device.

A first aspect of the invention comprises liquid ejecting head including a fluid channel forming substrate having a pressure generating chamber formed therein which communicates with a nozzle opening that ejects a liquid droplet and a piezoelectric element. The piezoelectric unit includes a first electrode, a piezoelectric material layer that is provided on the first electrode, the piezoelectric material layer having a perovskite structure indicated by a general formula: $ABO_3$, and a second electrode formed on the piezoelectric material layer opposite to the first electrode. The piezoelectric material layer has a monoclinic structure, and an angle formed between the direction of an electric field generated between the first electrode and the second electrode and an orientation of a polarization moment of the piezoelectric material layer is greater than an angle formed between the direction of the electric field when the piezoelectric constant of the piezoelectric material layer reaches a maximum level and the orientation of the polarization moment of the piezoelectric material layer.

With this configuration, by regulating the orientation of the polarization moment, it is possible to reduce the rate of change of a displacement amount of the piezoelectric element at a time when a wear phenomenon in which the polarization of the piezoelectric material layer is partially fixed occurs due to application of the electric field.

A liquid ejecting apparatus according to a second aspect of the invention includes the liquid ejecting head according to the first aspect of the invention and a driving unit that applies a voltage across the first electrode and the second electrode so as to generate an electric field in a predetermined direction on the piezoelectric element. With this configuration, the rate of change of the displacement amount can be suppressed and the liquid ejecting apparatus having improved reliability can be realized.

A third aspect of the invention includes a piezoelectric element constituted by a first electrode, a piezoelectric material layer that is provided on the first electrode and has a perovskite structure indicated by a general formula: $ABO_3$ and a second electrode formed on the piezoelectric material layer at the side opposite to the first electrode. The piezoelectric material layer has a monoclinic structure, and an angle formed between a direction of an electric field generated between the first electrode and the second electrode and an orientation of a polarization moment of the piezoelectric material layer is greater than an angle formed between the direction of the electric field at a time when the piezoelectric constant of the piezoelectric material layer reaches the maximum level and the orientation of the polarization moment of the piezoelectric material layer.

With this configuration, by regulating the orientation of the polarization moment, it is possible to prevent enlarging of a rate of change of a displacement amount of the piezoelectric element when a wear phenomenon in which the polarization of the piezoelectric material layer is partially fixed, occurs due to application of the electric field.

BRIEF DESCRIPTION OF THE DRAWINGS

The invention will be described with reference to the accompanying drawings, wherein like numbers reference like elements.

DESCRIPTION OF EXEMPLARY EMBODIMENTS

The invention will be described in detail on the basis of preferable embodiments.

First Embodiment

Figure 1:
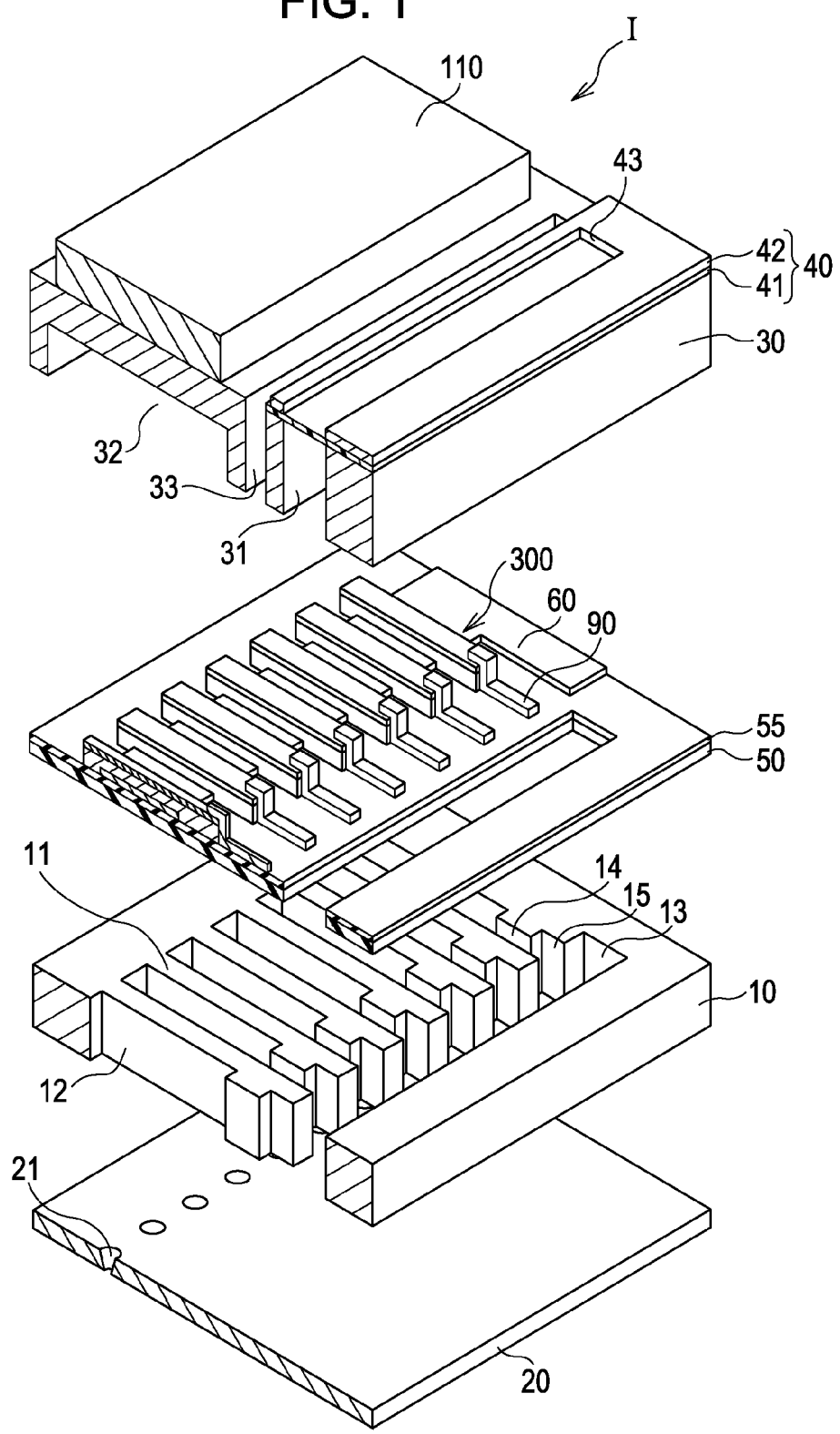
FIG. 1 is an exploded perspective view showing a schematic structure of a recording head according to a first embodiment of the invention.
Figure 2A:
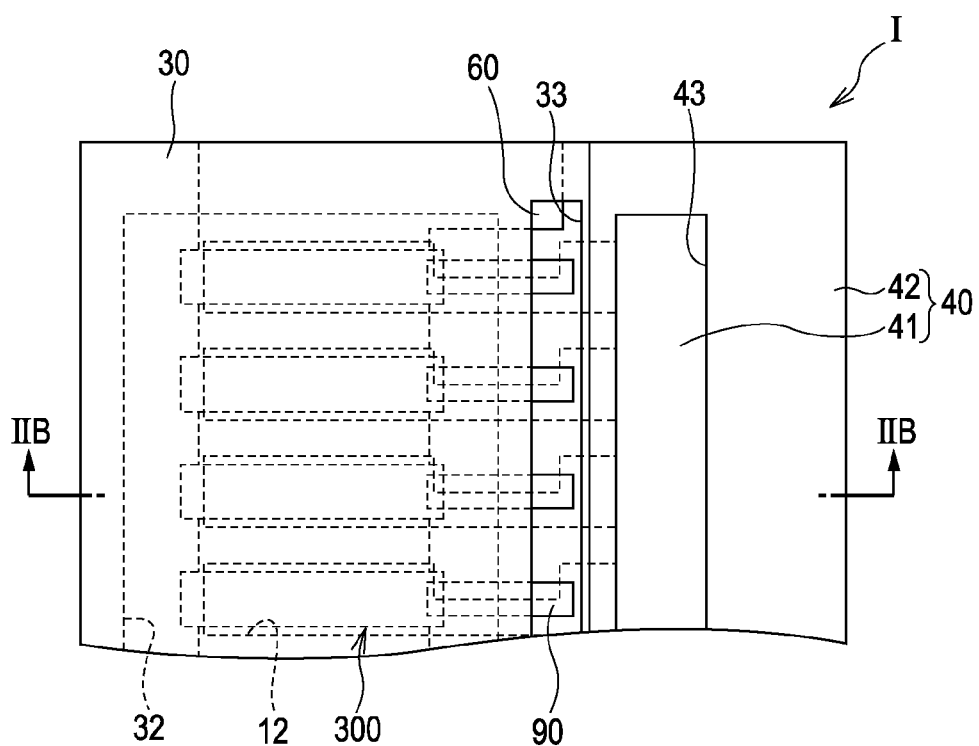
FIG. 2A is a plan view showing the structure of the recording head according to the first embodiment of the invention.

FIG. 1 is an exploded perspective view showing a schematic structure of an ink jet recording head, which is an example of a liquid ejecting head according to a first embodiment of the invention. FIG. 2A is a plan view showing the structure of the ink jet recording head shown in FIG. 1 and FIG. 2B is a cross sectional view showing the structure of the ink jet recording head taken along line IIB to IIB in FIG. 2A.

Figure 2B:
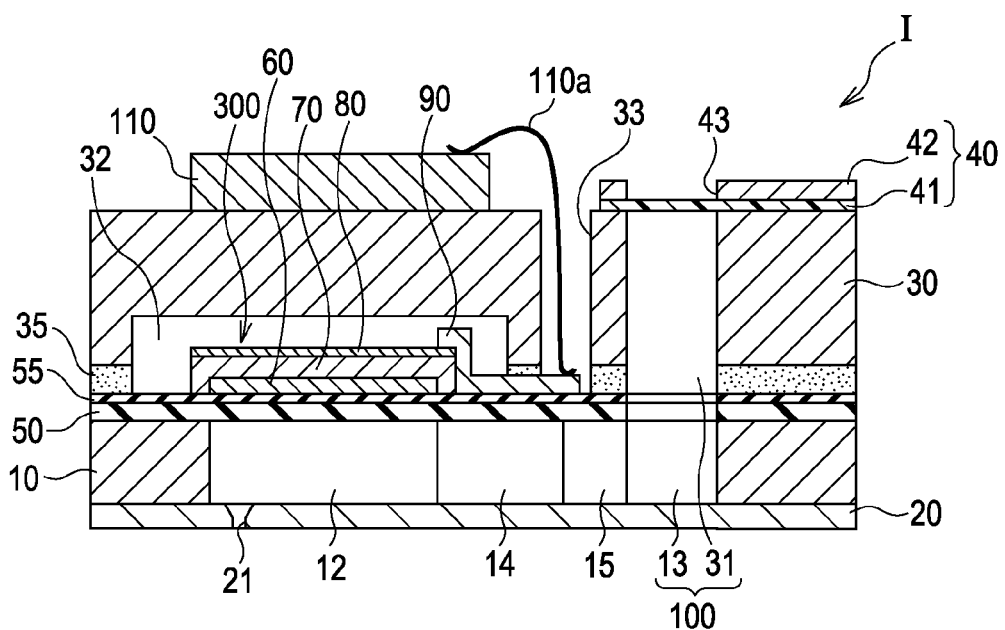
FIG. 2B is a cross sectional view showing the structure of the recording head according to the first embodiment of the invention.

The fluid channel forming substrate 10 shown in FIGS. 1 to 2B is formed of a silicon monocrystalline substrate. An elastic film 50 formed of silicon oxide is provided on one face of the substrate 10

A plurality of pressure generating chambers 12 are arranged in the fluid channel forming substrate 10 in the width direction thereof. A communicating portion 13 is formed in a region at the outside of the pressure generating chambers 12 in the long side direction thereof in the fluid forming substrate 10. The communicating portion 13 communicates with each of the pressure generating chambers 12 via respective ink supply channels 14 and communication channels 15 which are provided so as to correspond to the pressure generating chambers 12. The communicating portion 13 communicates with a reservoir portion 31 on a protection substrate (described later) so as to form a part of a reservoir as a common ink chamber for the pressure generating chambers 12. Each of the ink supply channels 14 is constituted in such a manner that the width thereof is smaller than that of the pressure generating chamber 12 so that the resistance level is held constant for ink flowing into the pressure generating chamber 12 from the communicating portion 13.

In the embodiment, while the width of the fluid channel is narrowed by modifying the width of one side so as to form the ink supply channel 14, it is possible to narrow the fluid channel from both sides to form the ink supply channel 14. In addition, the ink supply channel 14 can be formed by narrowing the fluid channel from the thickness direction not from the width direction.

In the embodiment, the fluid channel having the pressure generating chambers 12, the communicating portion 13, the ink supply channels 14 and the communication channels 15 are provided in the fluid channel forming substrate 10

In addition, a nozzle plate 20 having nozzle openings 21 is attached to the fluid channel forming substrate 10 using an adhesive or a heat weldable film, so that each nozzle opening 21 communicates with a corresponding pressure generating chamber. The nozzle plate 20 is made of, for example, a glass ceramic, a silicon monocrystalline substrate or stainless steel.

On the other hand, as described above, the elastic film 50 is formed on the opposite side of the fluid channel forming substrate 10, and an insulation material film 55 is formed on the elastic film 50. The elastic film 50 is made of silicon oxide and has a thickness of 1000 nm. The insulation material film 55 is formed by a sputtering method and is formed of zirconium oxide including 2 mol % of yttrium. In addition, a first electrode 60, a piezoelectric material layer 70 and a second electrode 80 are laminated on the insulation material film 55 to form a piezoelectric element 300.

Here, the first electrode 60, the piezoelectric material layer 70 and the second electrode 80 are referred to collectively as the piezoelectric element 300. In general, the piezoelectric element 300 is constituted in such a manner that one of the electrodes of the piezoelectric element 300 is made to be a common electrode and the other electrode and the piezoelectric material layer 70 are formed for each pressure generating chamber 12 by a patterning process. In the embodiment, the first electrode 60 serves as the common electrode of the piezoelectric elements 300 and the second electrodes 80 serve as discrete electrodes of the respective piezoelectric elements 300. However, the first electrode 60 and the second electrodes 80 can be switched with each other depending on the specific drive circuit or wiring used. Here, in addition, the piezoelectric element 300 and a diaphragm that generates a displacement by being driven by the piezoelectric element 300 are referred to collectively as the actuator device. Meanwhile, the elastic film 50, the insulation material film 55 and the first electrode 60 function as the diaphragm in the above case. However, the structure is not limited thereto. For instance, it is possible to use only the first electrode 60 as the diaphragm without providing the elastic film 50 and the insulation material film 55. Alternatively, the piezoelectric element 300 itself can substantially double as the diaphragm.

The piezoelectric material layer 70 is a crystalline film that is formed on the first electrode 60 and has a perovskite structure consisting of a piezoelectric material of oxide indicated by a general formula: $ABO_3$ having a polarization structure. A variety of materials may be used for the piezoelectric material layer 70, for example, a ferroelectric material such as lead zirconate titanate (PZT) or a ferroelectric material including, added thereto, a metal oxide such as niobium oxide, nickel oxide or manganese oxide may be used. To be specific, it is possible to use lead titanate ($PbTiO_3$), lead zirconate titanate ($Pb(Zr, Ti)O_3$), lead zirconate ($PbZrO_3$), lead titanate lanthanum (($Pb, La)TiO_3$), lead zirconate titanate lanthanum (($Pb, La)(Zr, Ti)O_3$), or lead magnesium niobate zirconium titanate ($Pb(Zr, Ti)(Mg, Nb)O_3$). In the embodiment, PZT of $Pb(Zr_xTi_{1-x})O_3$, (x=0.5) is used as the piezoelectric material layer 70.

The crystal of the piezoelectric material layer 70 is preferentially oriented to a (100) plane in a pseudo-cubic expression, and the crystal has a monoclinic structure. The structure of the crystal of the piezoelectric material layer 70 markedly depends on manufacturing conditions. However, in a case where the film thickness of the piezoelectric material layer 70 is not greater than 5 μm, when, for example, the value "x" is made to be in a range of approximately 0.45 to 0.55, the piezoelectric material layer 70 can have the monoclinic structure. In the invention, the description of "crystal is preferentially oriented to a (100) plane" includes a case where all of the crystals are oriented to the (100) plane and a case where most of the crystals (e.g., 90% or more) are oriented to the (100) plane. As a result of an X-ray diffraction examination performed on the piezoelectric material layer 70 in the embodiment, the orientation percentage of the (100) plane was 92%. In addition, the description of "the crystal has the monoclinic structure" includes a case where all of the crystals have the monoclinic structure and a case where most of the crystals (e.g., 90% or more) have the monoclinic structure and the remaining crystals which are not monoclinic have a tetragonal structure.

Moreover, the orientation of a polarization moment of the piezoelectric material layer 70 is inclined at a predetermined angle with respect to a direction perpendicular to the surface of the layer (a thickness direction of the piezoelectric material layer 70). The angle formed between a direction of an electric field generated between the first electrode 60 and the second electrode 80 and the orientation of the polarization moment of the piezoelectric material layer 70 is greater than the angle formed between a direction of the electric field at a time when a piezoelectric constant ($d_{31}$) reaches its maximum level and the orientation of the polarization moment of the piezoelectric material layer 70

Figure 3:
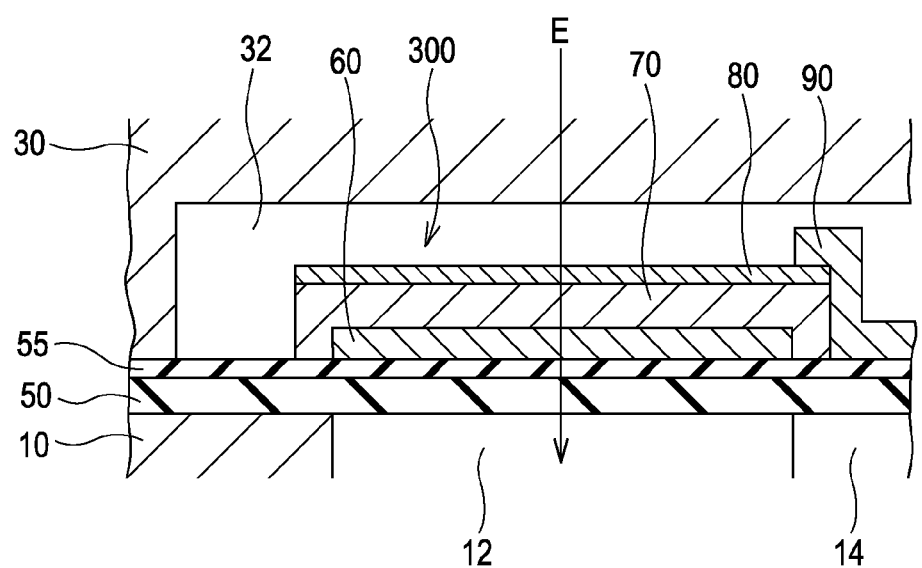
FIG. 3 is an enlarged cross sectional view showing a main part of the recording head according to the first embodiment of the invention.

To be specific, as shown in FIG. 3, when a voltage is applied to the piezoelectric material layer 70 from the second electrode 80 toward the first electrode 60, an electric field E directing to the first electrode 60 from the second electrode 80 is generated. Here, the application of the voltage toward the first electrode 60 from the second electrode 80 causes the first electrode 60 to have a negative polarity relative to the second electrode 80. Driving of the piezoelectric element 300 by the above application of the voltage includes ejection driving for driving the piezoelectric element 300 so as to eject an ink droplet from the nozzle opening 21 and micro-vibration driving for driving the piezoelectric element 300 to the extent that an ink droplet is not ejected. The driving unit and a driving pulse for applying a voltage to the piezoelectric element 300 will be described more fully below.

The polarization moment is oriented in a (111) plane in the direction of the electric field E at a time when the piezoelectric constant ($d_{31}$) of the piezoelectric material layer 70 reaches its maximum level, i.e., in an engineered domain arrangement. In this case, the angle formed between the direction of the electric field E at a time when the piezoelectric constant ($d_{31}$) of the piezoelectric material layer 70 reaches its maximum level and the orientation of the polarization moment of the piezoelectric material layer 70 becomes θ0 (see FIGS. 4A and 5). When the crystal structure of the piezoelectric material layer 70 has, for example, the perovskite type structure represented by the pseudo-cubic expression, the angle θ0 is approximately 57 degrees.

In this embodiment, an angle θa formed between the orientation of the polarization moment of the piezoelectric material layer 70 and the direction of the electric field E is made greater than the angle θ0 formed between the electric field E at a time when the piezoelectric constant ($d_{31}$) of the piezoelectric material layer 70 reaches its maximum level and the orientation of the polarization moment of the piezoelectric material layer 70.

Figure 4A:
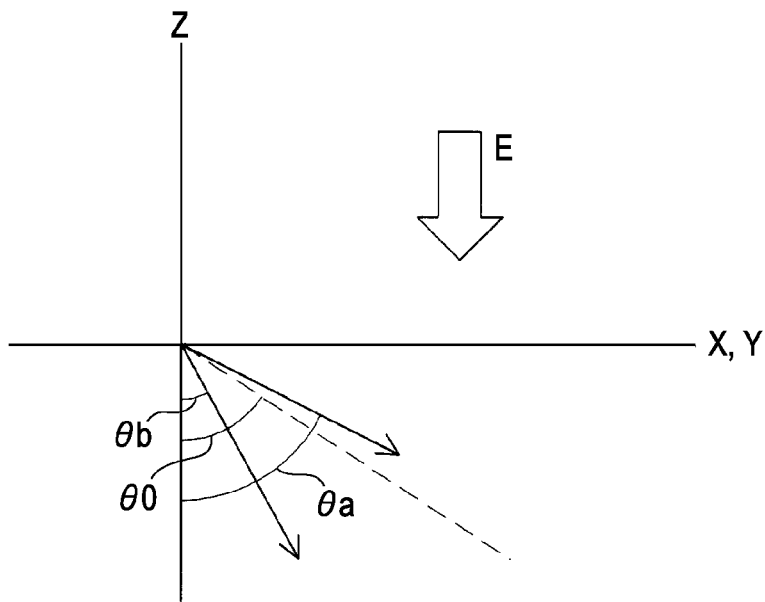
FIGS. 4A and 4B are graphs showing an orientation of a polarization moment according to the first embodiment of the invention.
Figure 5:
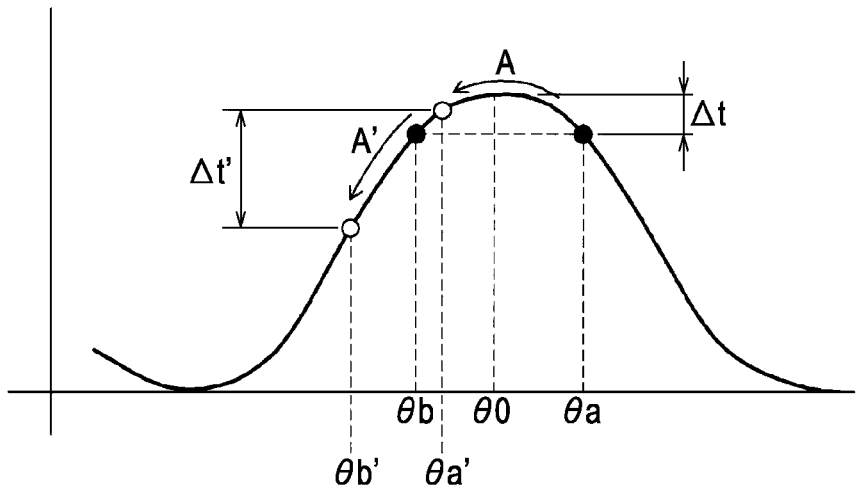
FIG. 5 is a graph showing the orientation of the polarization moment according to the first embodiment of the invention.

When the angle θa is greater than the angle θ0 as shown in FIG. 4A, when the piezoelectric element 300 is repeatedly driven while generating the electric field E by applying the voltage to the first electrode 60 from the second electrode 80, the wear phenomenon, wherein the orientation of the polarization is partially fixed along the electric field applying direction, occurs so that the orientation of the polarization moment (the angle θa) is moved in a direction A along a curve shown in FIG. 5, so as to be angle θb. At that time, since the piezoelectric constant ($d_{31}$) passes through a point of a maximum value where increase and decrease of the piezoelectric constant is inverted in accordance with the change of the angle, the rate of change Δt of the piezoelectric constant ($d_{31}$) becomes comparatively small.

Figure 4B:
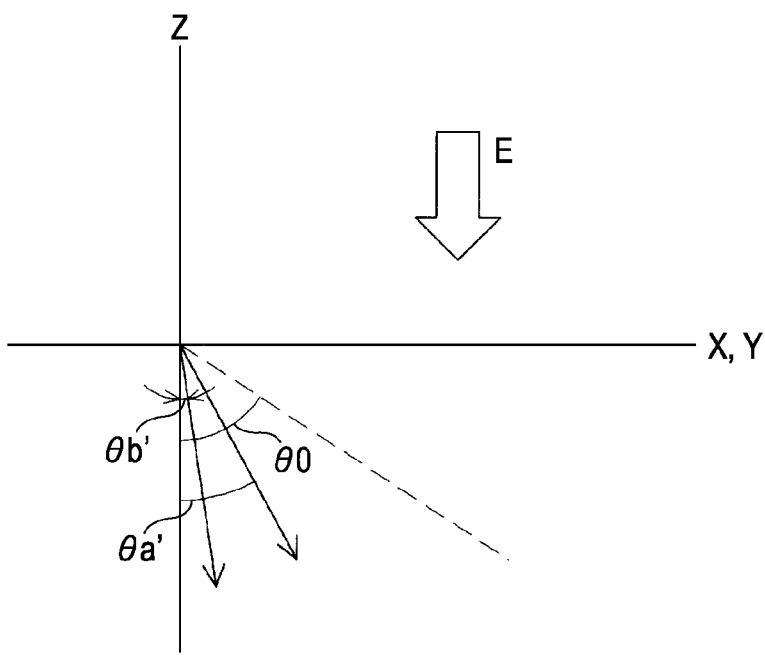

In contrast, in a case where, for example, an angle θa' formed between the orientation of the polarization moment and the direction of the electric field E is smaller than the angle θ0 as shown in FIG. 4B, the orientation of the polarization moment (the angle θa') is moved in a direction A' along the curve shown in FIG. 5 to be an angle θb' due to the wear phenomenon. Since the piezoelectric constant is changed so as to be simply lowered in accordance with the change of the angle (change from θa' to θb'), the rate of change Δt' becomes greater than the rate of change Δt even when the same wear phenomenon occurs.

As described above, the fact that the rate of change Δt of the piezoelectric constant ($d_{31}$) due to repeated driving of the piezoelectric material layer 70 is small, means that a rate of change of a displacement amount at a time when the piezoelectric element 300 is repeatedly driven is low. Namely, when the rate of change of the displacement amount of the piezoelectric element 300 due to repeated driving thereof is low, a difference between the displacement amount at the initial use and the displacement amount after the repeated driving becomes small. As a result, an ink ejection characteristic such as an ejection amount or an ejection speed of ink does not vary during the use of the piezoelectric element 300 so that it is possible to maintain stable printing conditions, thereby achieving a high quality print.

The above described orientation of the polarization moment of the piezoelectric material layer 700 can be acquired in such a manner that an inner electric field is measured by measuring the phase of an electron beam in accordance with an intensity transport equation and a measuring an electric field based on the result of the phase using a transmission electron microscope.

To be specific, a bright field image (a focused image of only a transmission wave) of the transmission electron microscope is utilized. Three images having the same focus including an image at a right focus position and images at under-focus and over-focus positions with respect to the image at the right focus position are prepared, and the deviation of intensity in a propagation direction is approximated by the difference of an observed intensity (the intensity transport equation) so as to measure a phase. The phase is deviated in order to obtain an electric field vector.

Since the electric field vector (a vector direction of the inner electric field formed by the polarization moment) is antiparallel to the vector direction of the polarization moment, it is possible to measure the orientation of the polarization moment (the angle with respect to the direction of the electric field) of the piezoelectric material layer 70 by measuring the electric field vector of the piezoelectric material layer 70.

In addition, since an absolute value of the inner electric field is proportional to an absolute value of the polarization moment, it is possible to perform a relative comparison between absolute values of the polarization moment by performing a relative comparison between absolute values of the inner electric field.

Figure 6:
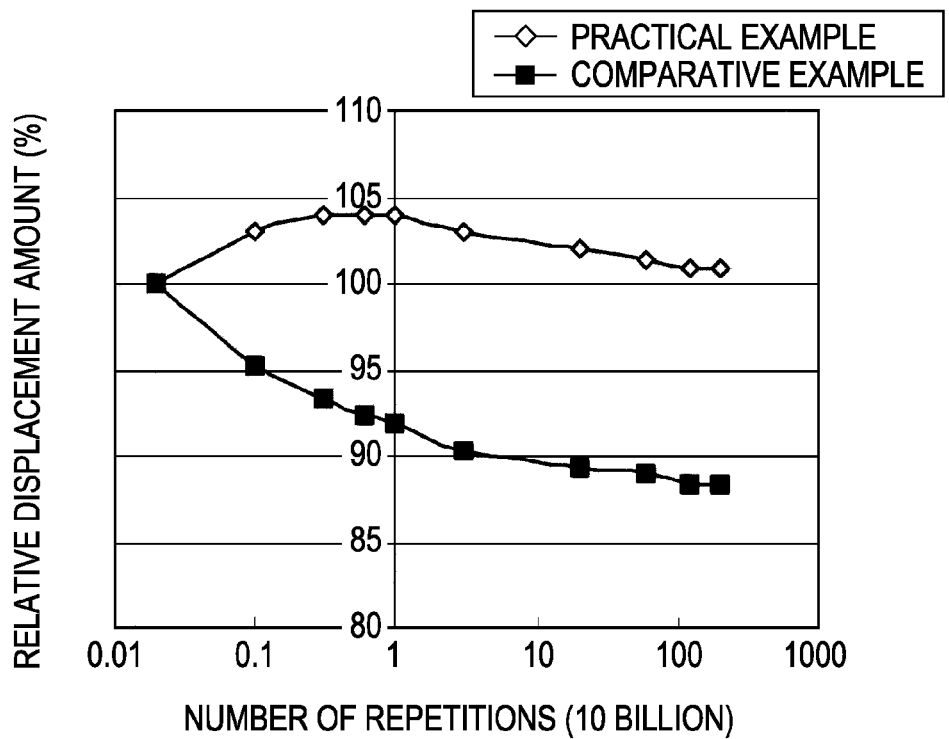
FIG. 6 is a graph showing an examination result of the invention.

Thus, by regulating the orientation of the polarization moment, the rate of change of the displacement amount due to repeated driving of the piezoelectric material layer 70 can be decreased. Namely, the durability can be improved. For example, in the case where, as described above, the angle θ0 indicative of the direction by which the piezoelectric constant reaches its maximum level, is 55 degrees, it is possible to make the rate of change of the displacement amount of the piezoelectric material layer 70 can be not lower than 5% (a practical example) even when the piezoelectric material layer 70 is repeatedly driven 20 billion times as shown in FIG. 6 under a condition that the angle θa indicative of the orientation of the polarization moment is 58 degrees, i.e., greater than the angle θ0 by 3 degrees. In contrast, when the above described angle θa' is formed between the orientation of the polarization moment and the direction of the electric field, so as to be smaller than the angle θ0, such as for example, 52 degrees, the rate of change of the displacement amount of the piezoelectric material layer 70 due to repeated driving is made to be greater by approximately 10% as shown in FIG. 6 (a comparative example). Therefore, it is preferable that the angle θa indicative of the orientation of the polarization moment is greater than the angle θ0 by 3 degrees or more. When the angle θa is greater than the angle θ0 by 20 degrees or more, the piezoelectric constant continuously increases in an endurance test. However, a problem may arise that the displacement amount at the initial stage is lowered. Therefore, it is preferable that the difference between the angle θa and the angle θ0 is made equal to or smaller than 20 degrees.

In addition, as shown in FIG. 6, the displacement amount of the piezoelectric material layer 70 of the practical example increases in accordance with the number of repetitions along with the repeated application of the electric field (preferably increases at the rate of change not greater than 5%), and then gradually decreases. As a result, it is possible to suppress the rate of change of the displacement amount as compared to a case that the displacement amount continuously decreases in accordance with the number of repetitions along with the repeated application of the electric field as in the comparative example shown in FIG. 6. Moreover, since the displacement amount of the piezoelectric material layer 70 of the practical example increases in accordance with increase of the number of repetitions with the repeated application of the electric field and then gradually decreases, the piezoelectric material layer 70 can be used immediately. Typically, when the rate of change of the displacement amount at the initial stage is great, such as in the comparative example shown in FIG. 6, it is necessary to perform a driving process so as to partially fix the polarization until the rate of change becomes stable beyond the rate of change of great displacement amount before the device may be used. However, using embodiments described herein, it is not necessary to perform the driving process for partially fixing the polarization, thereby reducing the cost.

Note that, FIG. 6 is a graph indicating the examination results of the practical example and the comparative example.

The orientation of the polarization moment can be adjusted to allow it to have a desired angle with respect to the direction of the electric field in such a manner that, for example, an oxygen deficient layer that is more deficient in oxygen than any other region is provided on the piezoelectric material layer 70 at the second electrode side, or a grounding material may be used for the first electrode 60 at the piezoelectric material layer 70 side when the piezoelectric material layer 70 is formed by performing an epitaxial growth process.

When an oxygen deficient layer exists on the piezoelectric material layer 70 at the second electrode 80 side, the oxygen deficient layer functions as a virtual plus bivalent ion so that the inner electric field from the second electrode 28 acts on the piezoelectric material layer 70 toward the first electrode 60 from the second electrode 80. The generated inner electric field can be adjusted by a degree of deficiency of oxygen so that the orientation of the polarization moment can be adjusted as desired by an action of the inner electric field.

In addition, it is possible to adjust the orientation of the polarization moment of the piezoelectric material layer 70 as desired by choosing a material of a ground layer of the piezoelectric material layer 70. When, for example, lanthanum nickel oxide (LNO) is used for the material of the ground layer of the piezoelectric material layer 70, since a lattice constant in a plane of the LNO is smaller than a general lattice constant in a plane of the piezoelectric material layer 70, the piezoelectric material layer 70 is formed on the LNO having a contracted lattice constant in the plane. Thus, the lattice constant in the plane of the piezoelectric material layer 70 is expanded or contracted depending on the material used for the ground layer so that the orientation of the polarization moment can be adjusted based on the expansion or contraction of the lattice constant.

In addition, while the voltage is applied toward the first electrode 60 from the second electrode 80 in the embodiment described above, the direction of application of the voltage is defined by a driving unit provided on an ink jet recording apparatus II, which will be described more fully below. As a result, the voltage can be applied toward the second electrode 80 from the first electrode 60 by the driving unit.

The thickness of the piezoelectric material layer 70 is not specifically limited. However, it is preferable to suppress the thickness so as to be at a level not generating a crack in a manufacturing process but exhibiting a sufficient displacement characteristic. When, for example, the piezoelectric material layer 70 is formed to have the thickness in the range of roughly 0.2 to 4 μm, a desired crystal structure can be readily obtained. In the embodiment, the piezoelectric material layer 70 is made to have the thickness of 1.2 μm in order to acquire an optimum piezoelectric characteristic.

The manufacturing method of the piezoelectric material layer 70 is not specifically limited. For example, the piezoelectric material layer 70 can be formed by using a so-called sol-gel method in which a sol having an organic metal compound dissolved and dispersed in a solvent is applied and dried to form a gel, and the gel is baked at a high temperature so as to obtain the piezoelectric material layer 70 made of metal oxide. Needless to say, the manufacturing method of the piezoelectric material layer 70 is not limited to the sol-gel method, and, for example, a MOD (Metal-Organic Decomposition) method or a sputtering method can also be used.

In addition, the second electrode 80 is, for example, formed of iridium (Ir) having a thickness of 200 nm. The second electrode 80 functions as a discrete electrode of the piezoelectric element 300. A lead electrode 90 which is made of, for example, gold (Au) and is led from a portion in the vicinity of the end of the second electrode 80 at the ink supply channel 14 side so as to extend to the insulation material film 55, is connected to the second electrode 80.

A protective substrate 30 having a reservoir portion 31 constituting at least a part of a reservoir 100 is bonded to the fluid channel forming substrate 10 having the piezoelectric element 300 formed thereon with an adhesive 35 formed therebetween. That is, the protective substrate 30 is provided on the lower electrode film 60, the insulation material film 55 and the lead electrodes 90. The reservoir portion 31, in the embodiment, is formed so as to pass through the protective substrate 30 in the thickness direction over the width direction of the pressure generating chambers 12. The reservoir portion 31 communicates with the communicating portion 13 of the fluid channel forming substrate 10 so as to form the reservoir 100 which serves as the common ink chamber for the pressure generating chambers 12.

Alternatively, the communicating portion 13 of the fluid channel forming substrate 10 may be preferably divided into a plurality of portions for each of the pressure generating chambers 12, so that only the reservoir portion 31 may function as the reservoir 100. Moreover, in a preferred example, only the pressure generating chambers 12 are provided in the fluid channel forming substrate 10, and the ink supply channels 14 communicating with the reservoir 100 and the pressure generating chambers 12 are provided in a member, such as, for example, the elastic film 50 or the insulation material film 55, interposed between the fluid channel forming substrate 10 and the protective substrate 30.

A piezoelectric element holding portion 32 having a space which does not hinder the motion of the piezoelectric element 300 is provided in a region of the protective substrate 30, the region facing the piezoelectric elements 300. The piezoelectric element holding portion 32 may be sealed or may not be sealed as long as it has the space which does not hinder the motion of the piezoelectric element 300.

As the protective substrate 30, a material having roughly the same coefficient of thermal expansion as the fluid channel forming substrate 10 is preferably used, such as, for example, a glass material, ceramic material or the like. In this embodiment, a silicon monocrystalline substrate which is the same material as the fluid channel forming substrate 10 is used to form the protective substrate 30.

A through-hole 33 passing through the protective substrate 30 in the thickness direction is provided in the protective substrate 30. A portion in the vicinity of the end of the lead electrode 90 led from each piezoelectric elements 300 is provided so as to be exposed in the through-hole 33.

A drive circuit 110 that drives the juxtaposed piezoelectric elements 300 is fixed to the protective substrate 30. As the drive circuit 110, for example, a circuit board or a semiconductor integrated circuit (IC) can be used. The drive circuit 110 and the lead electrodes 90 are electrically connected to each other via connection wires 110*a* formed of conductive wires such as bonding wires.

A compliance substrate 40 constituted by a sealing film 41 and a fixing plate 42 is bonded on the protective substrate 30. Here, the sealing film 41 is made of a material having a low rigidity and a flexibility and one face of the reservoir portion 31 is sealed by the sealing film 41. The fixing plate 42 is made of a comparatively hard material. Since a region of the fixing plate 42 facing the reservoir 100 is made to be an open section 43 which is completely opened in the thickness direction, one face of the reservoir 100 is sealed only by the sealing film 41 having flexibility.

In the ink jet recording head I of the first embodiment, ink is taken from an ink flow-in hole connected to an outer ink supply unit (not shown), and inner portions from the reservoir 100 to the nozzle openings 21 are filled with the ink. After that, a voltage is applied across the first electrode 60 and the second electrode 80 corresponding to the pressure generating chamber 12 in accordance with a recording signal from the driving circuit 110. As a result, the elastic film 50, the insulation material film 55, the first electrode 60 and the piezoelectric material layer 70 are deflectively deformed so as to increase the pressure in each of the pressure generating chambers 12, thereby ejecting ink droplets from the nozzle openings 21.

Figure 7:
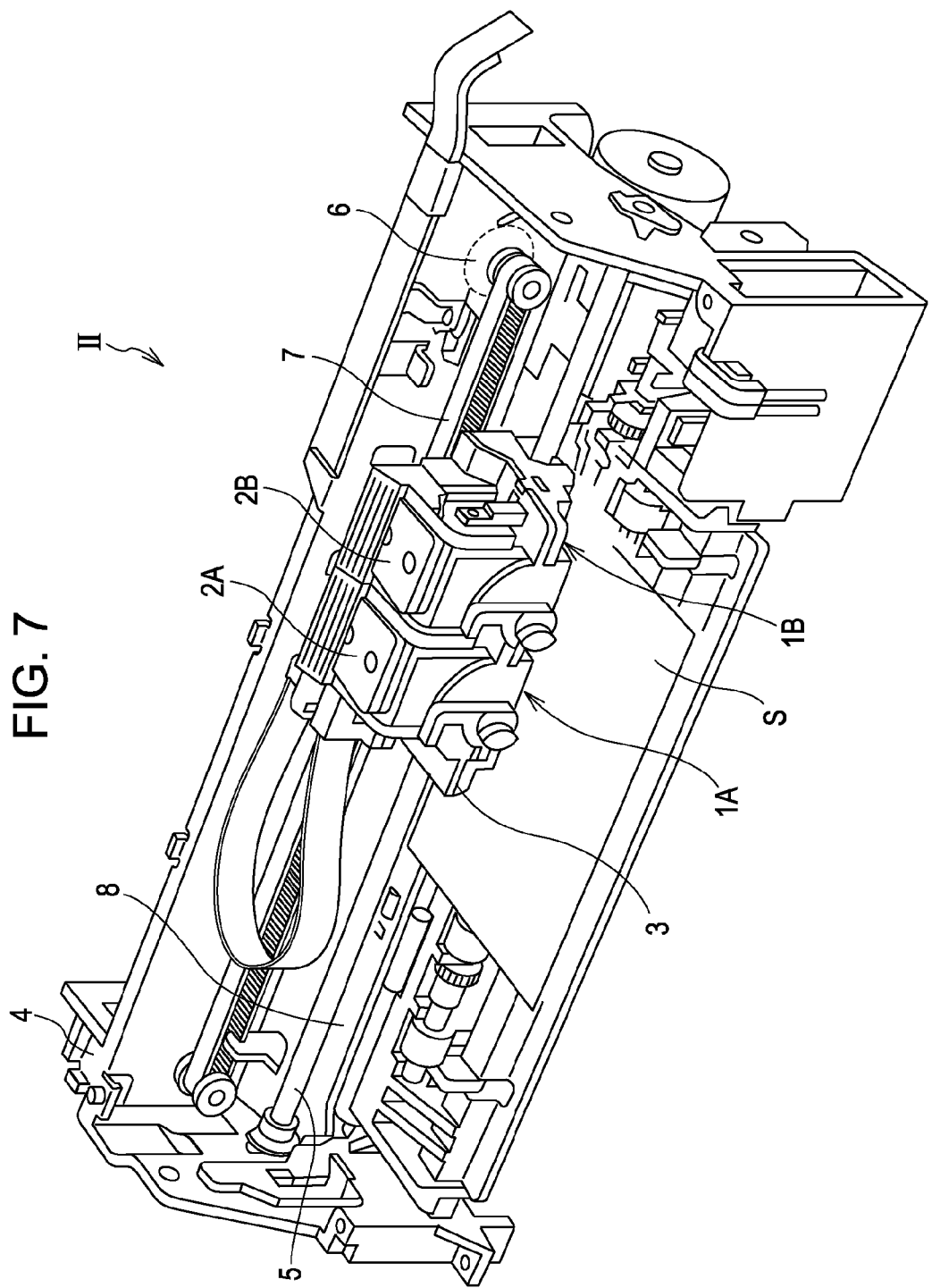
FIG. 7 is a schematic view showing a structure of a recorder according to the first embodiment of the invention.

The above described ink jet recording head I constitutes a part of a recording head unit having an ink fluid channel communicating with an ink cartridge and is mounted on the ink jet recording apparatus II. FIG. 7 is a schematic view showing an embodiment of the ink jet recording apparatus II.

In the ink jet recording apparatus II shown in FIG. 7, cartridges 2A and 2B forming the ink supply unit are detachably attached to recording head units 1A and 1B each having the ink jet recording head I. A carriage 3 having the recording head units 1A and 1B mounted thereon is attached to a carriage shaft 5 fixed to an apparatus frame 4 so as to be movable in the axial direction. The recording head units 1A and 1B are respectively adapted to eject, for example, a black ink composition and a color ink composition.

A driving force of a drive motor 6 is transmitted to the carriage 3 via a plurality of gears (not shown) and a timing belt 7 so that the carriage 3 having the recording head units 1A and 1B mounted thereon is moved along the carriage shaft 5. A platen 8 is provided on the apparatus frame 4 along the carriage shaft 5, and a recording sheet S as a recording medium such as paper fed from a paper feed roller (not shown) is wound around the platen 8 so as to be transported.

Figure 8:
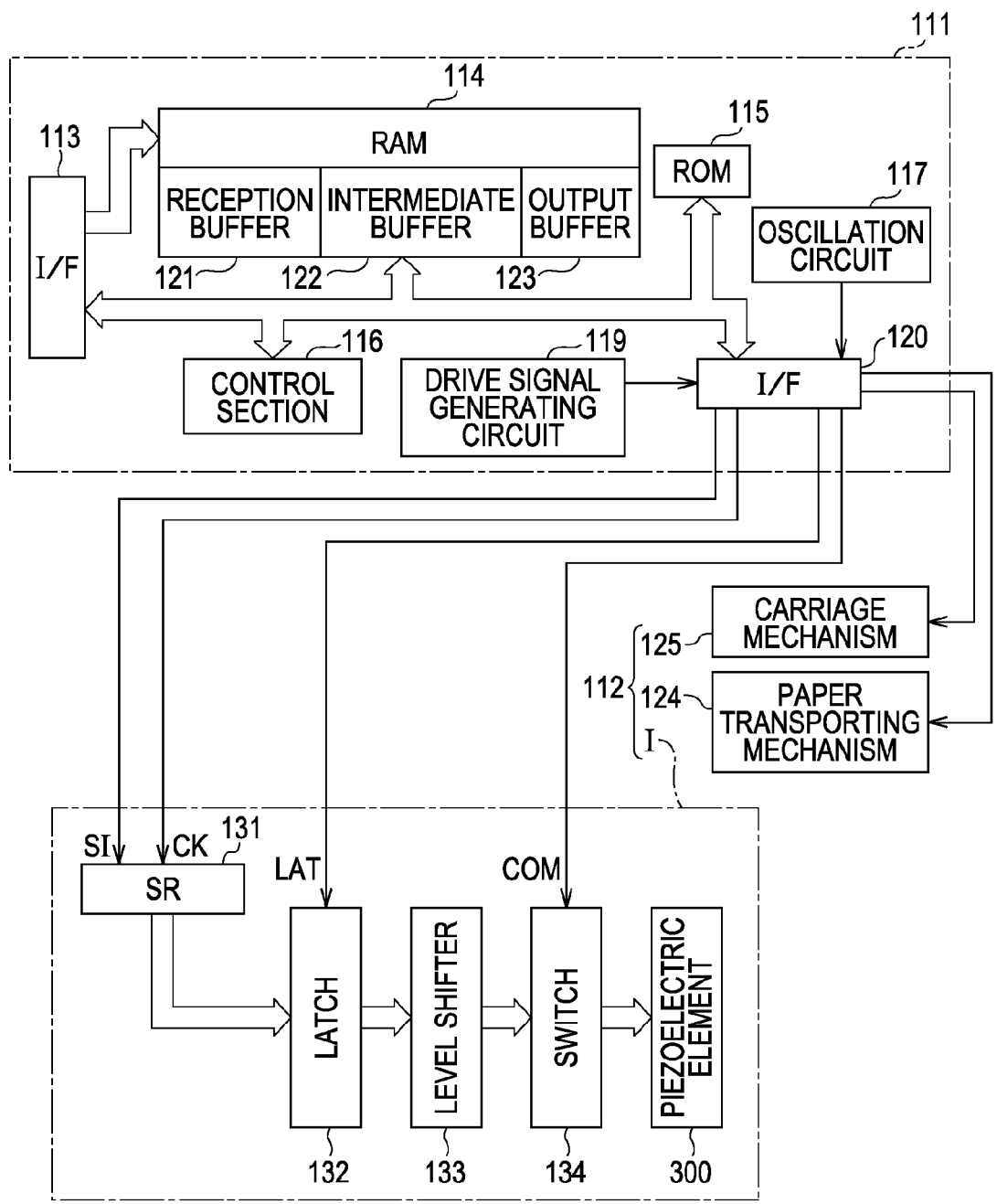
FIG. 8 is a block diagram showing a control structure according to the first embodiment of the invention.

In addition, the ink jet recording apparatus II is provided with a driving unit (not shown). Here, a control structure of the ink jet recording apparatus II will be described below. FIG. 8 is a block diagram showing the control structure of the ink jet recording apparatus II according to the embodiment.

The ink jet recording apparatus II according to the embodiment is mainly constituted by a printer controller 111 and a print engine 112 as shown in FIG. 8. The printer controller 111 includes an external interface 113 (hereinafter, referred to as external I/F 113), a RAM 114 that temporarily stores various kinds of data, a ROM 115 that stores a control program, a control section 116 mainly constituted by a CPU, an oscillation circuit 117 that generates a clock signal, a drive signal generating circuit 119 that generates a drive signal to be supplied to the ink jet recording head I, and an internal interface 120 (hereinafter, referred to as an internal I/F 120) that transmits dot pattern data (bitmap data) developed in accordance with a drive signal or print data to the print engine 112.

The external I/F 113 receives print data formed of, for example, a character code, a graphic function and image data from a host computer (not shown). A busy signal (BUSY) or an acknowledge signal (ACK) is output to the host computer via the external I/F 113. The RAM 114 functions as a reception buffer 121, an intermediate buffer 122, an output buffer 123 and a work memory (not shown). The reception buffer 121 temporarily stores print data received via the external I/F 113, the intermediate buffer 122 stores intermediate code data converted by the control section 116, and the output buffer 123 stores dot pattern data. The dot pattern data is formed of print data obtained by decoding (interpreting) gradation data.

The drive signal generating circuit 119 comprises a drive signal generating unit which generates a drive signal COM. The drive signal COM includes an ejection pulse for driving (driving for ejection) the piezoelectric element 300 so as to eject ink in one recording cycle and is repeatedly generated for each recording cycle T.

The ROM 115 stores a control program (a control routine) for allowing devices to perform various data processing operations, font data and a graphic function. The control section 116 reads print data in the reception buffer 121 and allows the intermediate buffer 122 to store intermediate code data obtained by converting the print data. In addition, the control section 116 analyzes the intermediate code data read from the intermediate buffer 122 and develops the intermediate code data into dot pattern data by referencing the font data and the graphic function stored in the ROM 115. The control section 116 applies necessary decorative processing to the dot pattern data and allows the output buffer 123 to store the developed pattern data.

When the dot pattern data for one row of the ink jet recording head I is prepared, the one row of dot pattern data is output to the ink jet recording head I via the internal I/F 120. After the one row of dot pattern data is output from the output buffer 123, the developed intermediate code data is deleted from the intermediate buffer 122, and then a process of developing next intermediate code data is performed.

The print engine 112 is mainly constituted by the ink jet recording head I, a paper transporting mechanism 124 and a carriage mechanism 125. The paper transporting mechanism 124 is constituted by a paper transporting motor and the platen 8, which sequentially feeds a recording sheet S such as recording paper in association with a recording operation of the ink jet recording head I. Namely, the paper transporting mechanism 124 relatively transports the recording sheet S in a sub-scanning direction.

The carriage mechanism 125 comprises by the carriage 3 to which the ink jet recording head I can be mounted, and a carriage driving section that moves the carriage 3 along a main scanning direction. By moving the carriage 3, the ink jet recording head I is moved in the main scanning direction. As described above, the carriage driving section is constituted by the drive motor 6 and the timing belt 7.

The ink jet recording head I has multiple nozzle openings 21 arranged in the sub-scanning direction and each of the nozzle openings 21 ejects a liquid droplet at a timing regulated by a dot pattern data. An electric signal such as the drive signal COM or print data (SI) is supplied to the piezoelectric element 300 on the ink jet recording head I via an external wire (not shown).

In the printer controller 111 and the print engine 112 constituted as the above, a drive unit that applies a predetermined drive signal to the piezoelectric elements 300 includes the printer controller 111, and the drive circuit 110 that includes a shift register 131, a latch 132, a level shifter 133 and a switch 134 which are adapted to selectively input a drive signal to the piezoelectric elements 300, the drive signal having a predetermined driving waveform output from the drive signal generating circuit 119.

The shift register 131, the latch 132, the level shifter 133, the switch 134, and the piezoelectric element 300 are provided for each nozzle opening 21, and these shift register 131, the latch 132, the level shifter 133, and the switch 134 generate a drive pulse in accordance with the drive signal COM generated by the drive signal generating circuit 119. The above described drive pulse is an application pulse to be actually applied to the piezoelectric elements 300.

Figure 9:
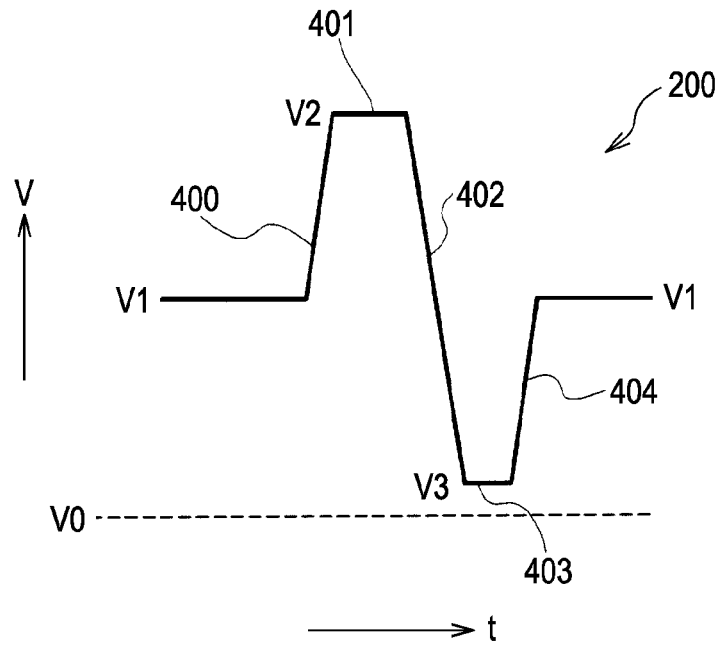
FIG. 9 is a waveform diagram showing a driving pulse according to the first embodiment of the invention.

FIG. 9 is a schematic view showing an example of the drive pulse according to the embodiment. A drive pulse 200 of the embodiment is applied to the second electrode 80 by making the first electrode 60 to be a reference electric potential V0 as shown in FIG. 9. The drive pulse 200 is constituted by a contracting process period 400 for contracting a volume of the pressure generating chamber 12 by raising a drive electric potential V from a first electric potential V1 higher than the reference electric potential V0 to a second electric potential V2 higher than the first electric potential V1, a first holding process period 401 for holding the second electric potential V2 for a predetermined time period, an expanding process period 402 for expanding the volume of the pressure generating chamber 12 by lowering the drive electric potential V from the second electric potential V2 to a third electric potential V3 which is lower than the first electric potential V1 and higher than the reference electric potential V0, a second holding process period 403 for holding the third electric potential V3 for a predetermined time period, and a process period 404 for raising the drive electric potential V from the third electric potential V3 to the first electric potential V1.

When the above drive pulse 200 is output to the piezoelectric element 300, the piezoelectric element 300 is deformed so as to contract the volume of the pressure generating chamber 12 during the contracting process period 400 so that a meniscus of the nozzle opening 21 is pushed out, Next, the piezoelectric element 300 is deformed so as to expand the volume of the pressure generating chamber 12 by the expanding process period 402 so that the meniscus of the nozzle opening 21 is suddenly drawn toward the pressure generating chamber 12. As a result, the ink pushed out the nozzle opening 21 is cut and the ink ejected from the nozzle opening 21 is allowed to fly as an ink droplet. Namely, the drive pulse 200 is for a so-called draw-and-eject method.

In terms of the piezoelectric material layer 70 of the embodiment, the description of the voltage being applied from the second electrode 80 toward the first electrode 60 indicates that since the reference electric potential V0 is applied to the first electrode 60, the first electric potential V1, the second electric potential V2 and the third electric potential V3 to be applied to the second electrode 80 are relatively higher than the reference electric potential V0. Even when the reference electric potential V0 has a positive polarity, when each of the first electric potential V1, the second electric potential V2 and the third electric potential V3 have a positive polarity and are higher than the reference electric potential V0, the second electrode 80 to which the first electric potential V1, the second electric potential V2 or the third electric potential V3 are applied, is made to have a positive polarity and the first electrode 60 is made to have a negative polarity.

In this embodiment, while all of the electric potential V1, the second electric potential V2 and the third electric potential V3 are made to be positive and higher than the reference electric potential V0 applied to the first electrode 60, the invention is not so limited. For example, the second electric potential V2 can be lower than the reference electric potential V0. That is, the second electrode 80 can have the negative potential. In the above case, when a factor defined by a voltage and an application time period indicated by integration of the drive pulse 200 based on the electric potential to be applied to the first electrode 60, is configured such that the factor at the positive side is greater than that at the negative side with respect to the reference potential V0, the above described effect of the invention is enhanced.

Second Embodiment

In the above described first embodiment, the voltage is applied from the second electrode 80 toward the first electrode 60. However, the voltage is applied from the first electrode 60 toward the second electrode 80 in the second embodiment of the invention.

Figure 10:
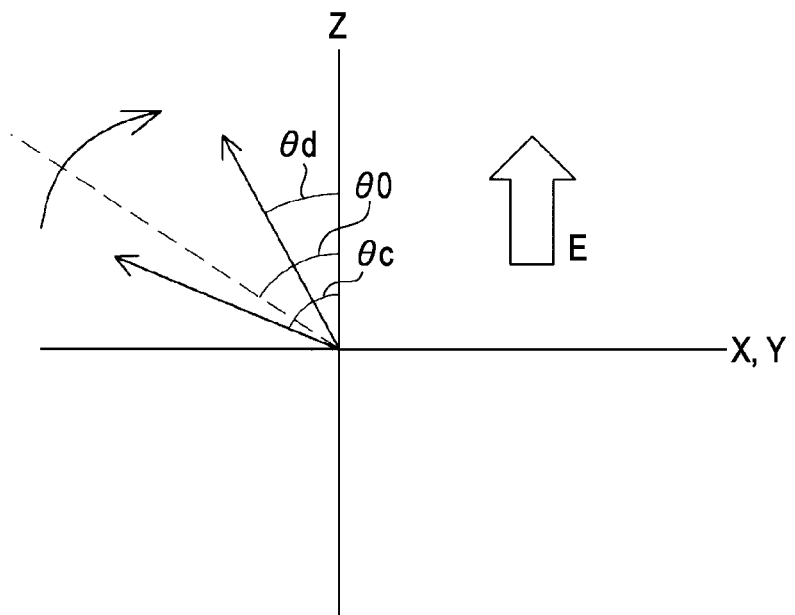
FIG. 10 is a graph showing an orientation of a polarization moment according to a second embodiment of the invention.

Here, the orientation of the polarization moment of the piezoelectric material layer 70 will be described with reference to FIG. 10. FIG. 10 is a graph showing the direction of the electric field and the orientation of the polarization moment. As shown in FIG. 10, an angle θc formed between the orientation of the polarization moment of the piezoelectric material layer 70 and the direction of the electric field is greater than the angle θ0 formed between the direction of the electric field at a time when the piezoelectric constant ($d_{31}$) reaches its maximum level and the orientation of the polarization moment of the piezoelectric material layer 70. Here, the inner electric field was measured similarly to the first embodiment. As a result of the measurement, the angle θ0 was 55 degrees and the angle θc was 60 degrees.

When the piezoelectric element 300 is repeatedly driven and the wear phenomenon occurs, an angle θd formed between the orientation of the polarization moment and the direction of the electric field is made smaller than the angle θ0. As a result, the rate of change of the piezoelectric constant ($d_{31}$), i.e., the lowering rate of the displacement amount of the piezoelectric material layer 70, can be decreased in a manner similar to the first embodiment. To be specific, when the driving process is repeated 20 billion time using the second embodiment of the invention, the displacement amount was initially increased by 2% with respect to the beginning of the displacement amount and it was finally decreased by 2% with respect to the beginning.

Figure 11:
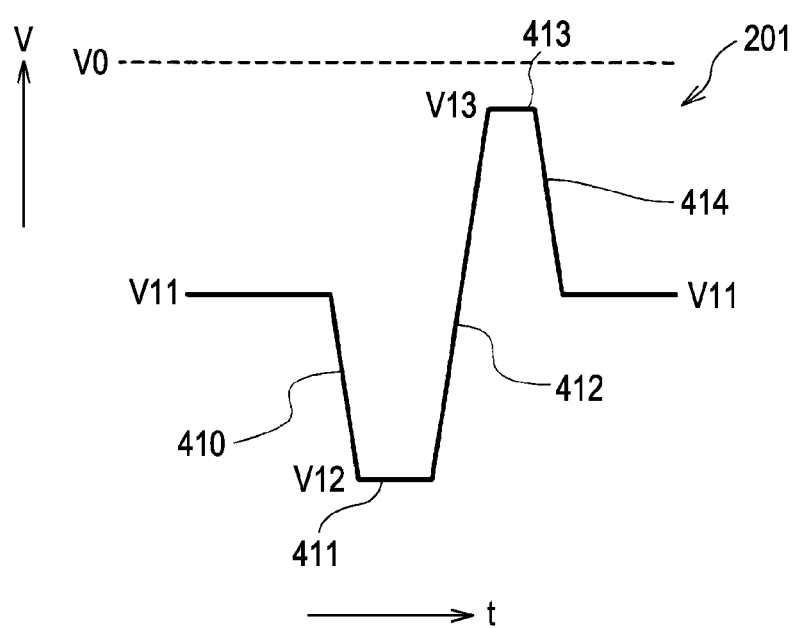
FIG. 11 is a waveform diagram showing a driving pulse according to the second embodiment of the invention.

Regarding the above described piezoelectric element 300, the drive pulse of the drive unit for driving the piezoelectric element 300 is made to be, for example, such as the drive pulse shown in FIG. 11.

Namely, a drive pulse 201 is applied to the second electrode 80 using the reference electric potential V0 of the first electrode 60. The drive pulse 201 includes an expanding process period 410 for expanding the volume of the pressure generating chamber 12 by lowering the drive electric potential V from a first electric potential V11 lower than the reference electric potential V0 (relatively having a negative polarity) to a second electric potential V12 lower than the first electric potential V11, a first holding process period 411 for holding the second electric potential V12 for a predetermined time period, a contracting process period 412 for contracting the volume of the pressure generating chamber 12 by raising the drive electric potential V from the second electric potential V12 to a third electric potential V13, a second holding process period 413 for holding the third electric potential V13 for a predetermined time period, and a process period 414 for returning the drive electric potential V from the third electric potential V13 to the first electric potential V11.

When the above drive pulse 201 is output to the piezoelectric element 300, the piezoelectric element 300 is deformed so as to expand the volume of the pressure generating chamber 12 by the expanding process period 410 so that a meniscus of the nozzle opening 21 is drawn toward the pressure generating chamber 12. Next, the piezoelectric element 300 is deformed so as to contract the volume of the pressure generating chamber 12 in the contracting process period 412 so that the meniscus in the nozzle opening 21 is markedly pushed out from the pressure generating chamber 12 and an ink droplet is ejected from the nozzle opening 21. Namely, the drive pulse 201 is for a so-called push-and-eject method.

Each of the first electric potential V11, the second electric potential V12 and the third electric potential V13 are lower than the reference electric potential V0. Therefore, using the above drive pulse 201, an electric potential having a positive polarity is applied to the first electrode 60 and an electric potential having a negative polarity is applied to the second electrode 80.

Third Embodiment

Figure 12A:
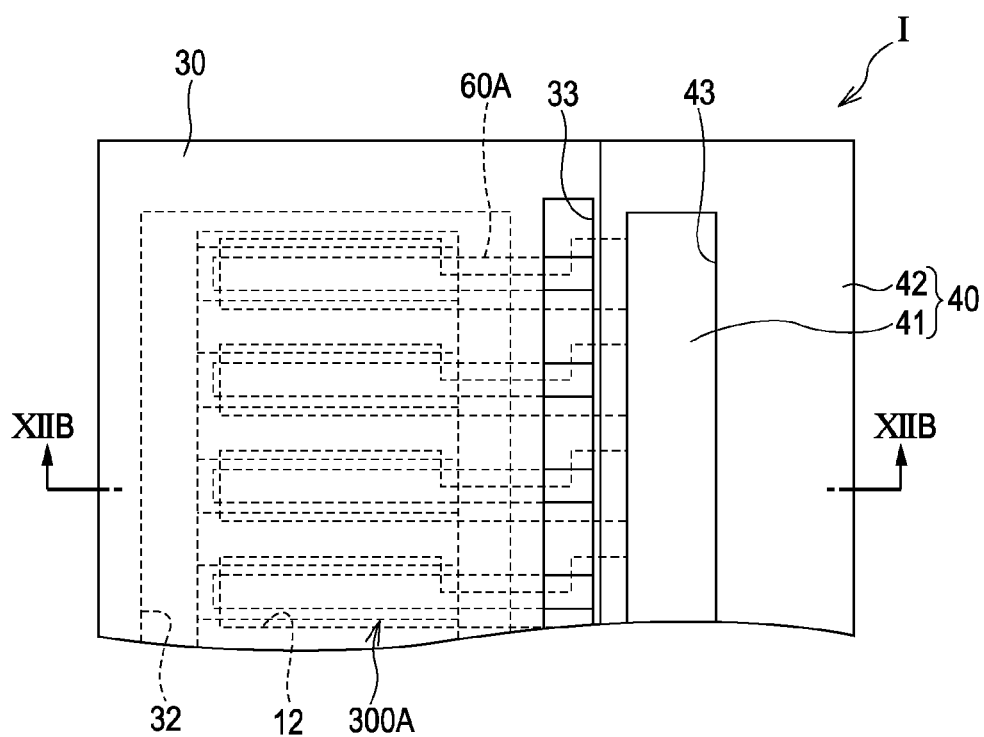
FIG. 12A is a plan view showing a structure of a recording head according to a third embodiment of the invention.
Figure 12B:
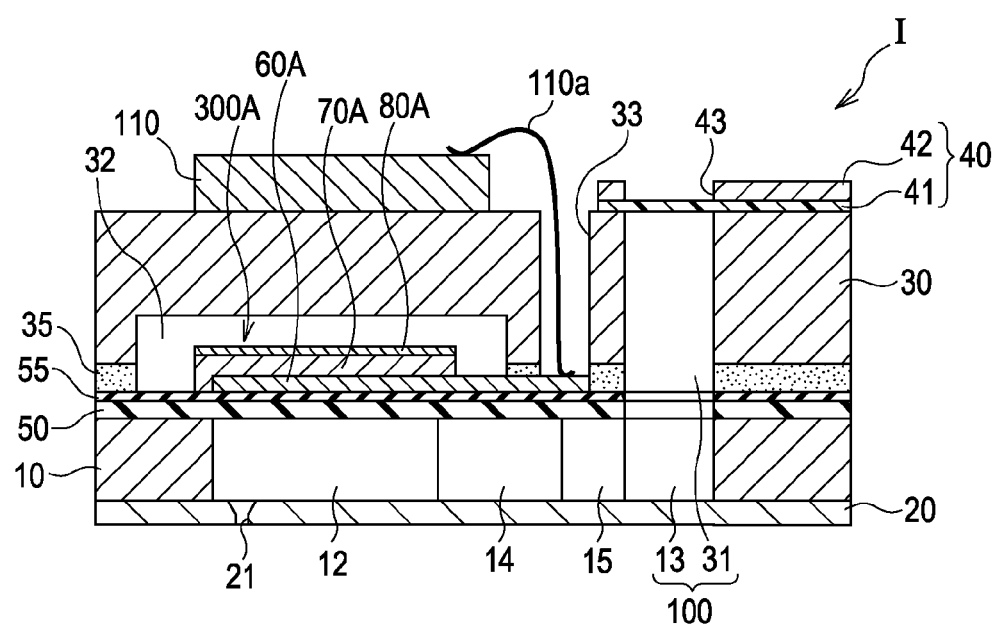
FIG. 12B is a cross sectional view showing the structure of the recording head according to the third embodiment of the invention.
Figure 13:
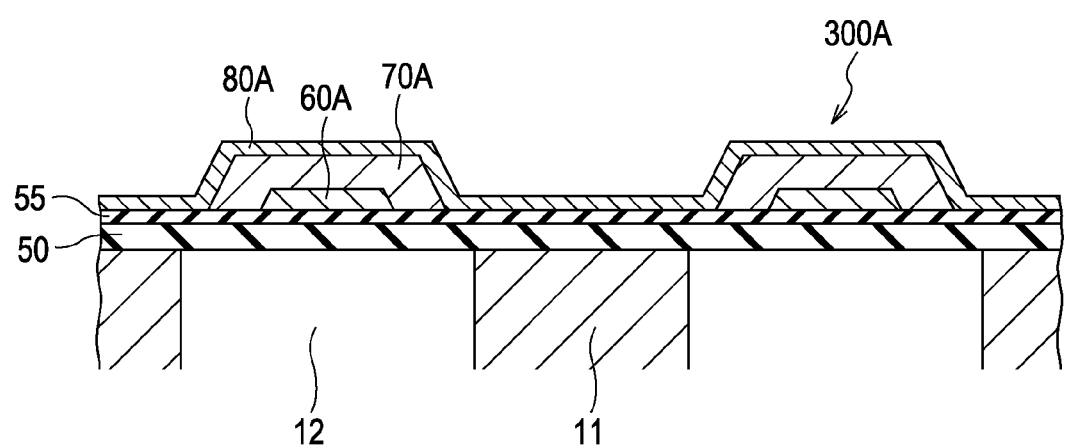
FIG. 13 is an enlarged cross sectional view showing a main part of the recording head according to the third embodiment of the invention.

FIG. 12A is a plan view of an ink jet recording head that is an example of a liquid jet head according to a third embodiment of the invention. FIG. 12B is a cross sectional view taken along a line XIIB to XIIB in the FIG. 12A. FIG. 13 is a cross sectional exploded view showing a main part of a pressure generating chamber of the recording head in the juxtaposed direction of the pressure generating chambers. Note that, the elements or members the same as in the above described first embodiment are denoted by the same numerals, and their descriptions are omitted.

As shown in FIGS. 12A through 13, an elastic film 50 is formed on a fluid channel forming substrate 10 constituting the ink jet recording head of the embodiment and an insulation material film 55 is formed on the elastic film 50. A piezoelectric element 300A constituted by a first electrode 60A, a piezoelectric material layer 70A and a second electrode 80A is provided on the insulation material film 55.

The first electrode 60A is provided on each of regions facing respective pressure generating chambers 12. The first electrode 60A is a discrete electrode of each piezoelectric element 300A. To be specific, the first electrode 60A is formed in such a manner that the width of the first electrode 60A in a short side direction of the pressure generating chamber 12 (in the juxtaposed direction of the pressure generating chambers 12) is smaller than the width of the pressure generating chamber 12. In addition, one end of the first electrode 60A in the lengthwise direction of the pressure generating chamber 12 (in a direction perpendicular to the juxtaposed direction of the pressure generating chambers 12) is drawn to the outside of the pressure generating chamber 12.

The piezoelectric material layer 70A is provided on the first electrode 60A corresponding to each pressure generating chamber 12. To be specific, the piezoelectric material layer 70A is provided on the first electrode 60A in such as manner that the piezoelectric material layer 70A covers both end faces in the width direction of the first electrode 60A (in the width direction of the pressure generating chamber 12) and the piezoelectric material layers 70A are compartmentalized so as to be discontinuous at a portion on a partition wall 11 between adjacent piezoelectric elements 300A. In addition, the piezoelectric material layer 70A has a size so as to cover one end portion of the first electrode 60A in the lengthwise direction (in the long side direction of the pressure generating chamber 12) and to expose the other end portion thereof. The end portion of the first electrode 60A exposed from the piezoelectric material layer 70A serves as a terminal to be electrically connected to a drive circuit for driving each of the piezoelectric elements 300A.

The second electrode 80A is a common electrode and is provided on each piezoelectric material layer 70A so as to be continuous over the plurality of piezoelectric material layers 70A. More specifically, the second electrode 80A is continuously provided over the piezoelectric material layers 70A and the insulation material films 55 each being disposed between the adjacent piezoelectric elements 300A.

In the piezoelectric elements 300A having the above structure, each piezoelectric material layer 70A is covered with the second electrode 80A. In particular, since the side of the piezoelectric material layer 70A is covered with the second electrode 80A, the piezoelectric material layer 70A can be protected from ambient moisture or the like by the second electrode 80A even when a protection film having moisture resistance is not provided on the piezoelectric elements 300A. With this configuration, it is possible to prevent lowering of the displacement amount of the piezoelectric element 300A which may occur when a protection film is provided thereon. Namely, by obviating the need of a protection film, it is possible to suppress the cost and to realize the piezoelectric element 300A with superior displacement characteristics.

In addition, since the first electrode 60A is a discrete electrodes formed for each of the plurality of piezoelectric elements 300A, it is possible to facilitate the application of a voltage from the first electrode 60A to the second electrode 80A similarly to the case of the above described second embodiment.

Fourth Embodiment

Figure 14A:
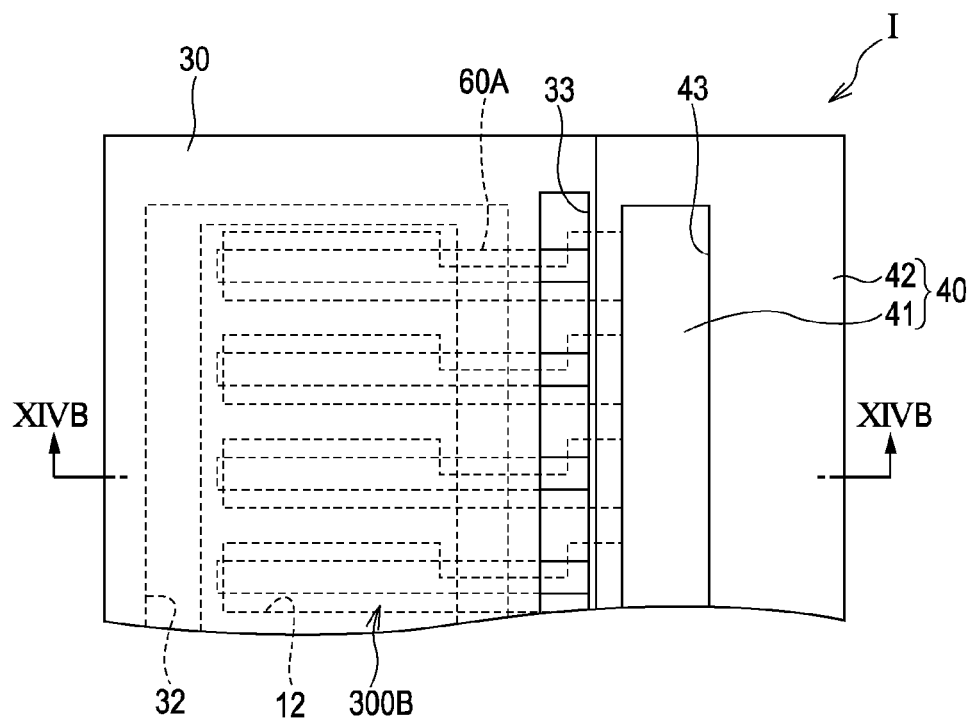
FIG. 14A is a plan view showing a structure of a recording head according to a fourth embodiment of the invention.
Figure 14B:
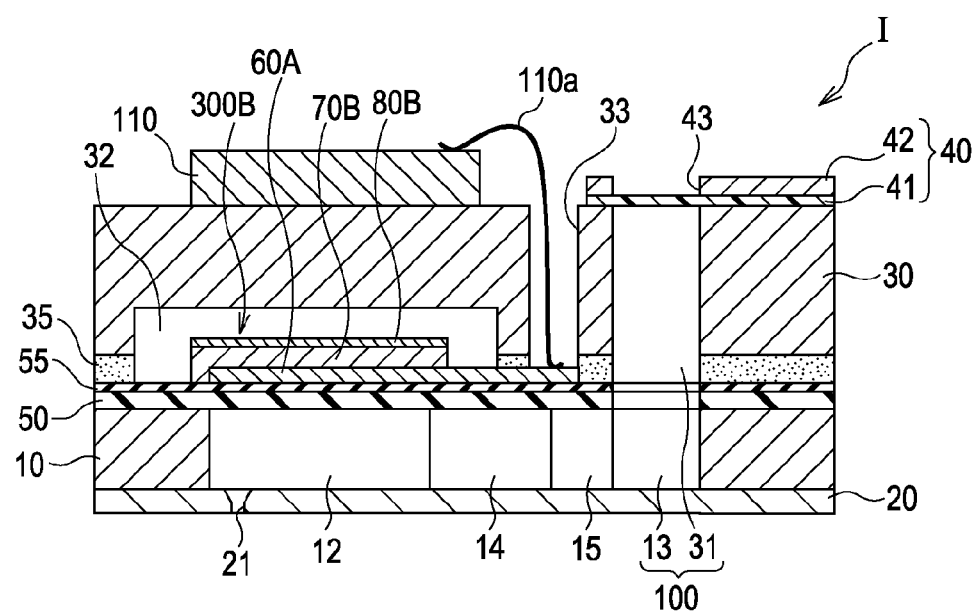
FIG. 14B is a cross sectional view showing the structure of the recording head according to the fourth embodiment of the invention.
Figure 15:
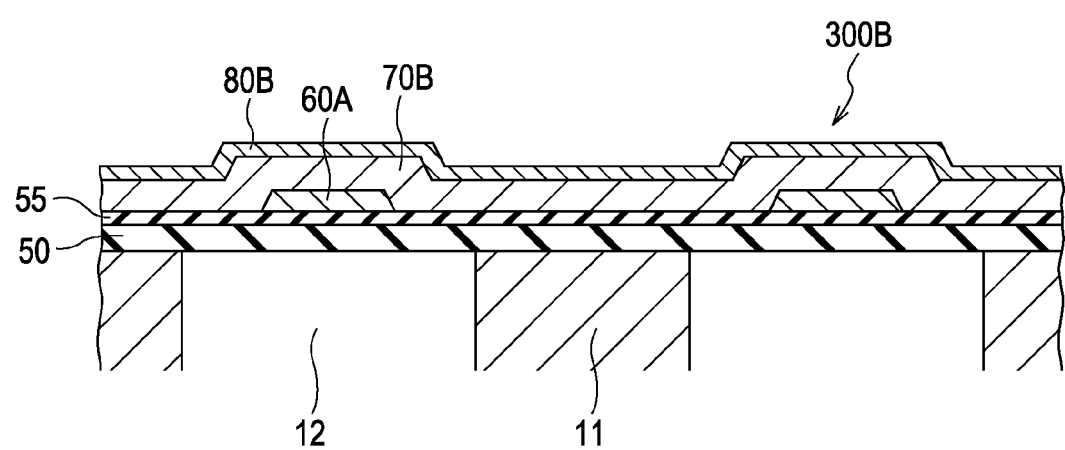
FIG. 15 is an enlarged cross sectional view showing a main part of the recording head according to the fourth embodiment of the invention.

FIG. 14A is a plan view of an ink jet recording head that is an example of a liquid jet head according to a Fourth Embodiment of the invention. FIG. 14B is a cross sectional view taken along a line XIVB to XIVB in the FIG. 14A. FIG. 15 is a cross sectional exploded view showing a main part of a pressure generating chamber of the recording head in the juxtaposed direction of pressure generating chambers. The elements or members the same as in the above described first embodiment are denoted by the same numerals, and their descriptions are omitted.

As shown in FIGS. 14A through 15, an elastic film 50 is formed on a fluid channel forming substrate 10 constituting the ink jet recording head of the embodiment and an insulation material film 55 is formed on the elastic film 50. A piezoelectric element 300B constituted by a first electrode 60A, a piezoelectric material layer 70B and a second electrode 80B, is provided on the insulation material film 55.

The first electrodes 60A are provided independently corresponding to pressure generating chambers 12, as described in the third embodiment of the invention.

The piezoelectric material layer 70B is provided on each of the first electrodes 60A so as to be continuous over the plurality of piezoelectric elements 300B. To be specific, the piezoelectric material layer 70B is formed over the first electrodes 60A and the insulation material films 55 so as to be continues toward the juxtaposed direction of the first electrodes 60A and to have a roughly uniform thickness. Here, the piezoelectric material layer 70B is not provided on one end of the first electrode 60A in the lengthwise direction thereof and no electrode is formed in the area where the piezoelectric material layer 70B is not provided.

The second electrode 80B is provided so as to be continuous over the plurality of piezoelectric material layers 70B. Namely, the second electrode 80B serves as a common electrode for the piezoelectric elements 300B so as to be continuous over the piezoelectric elements 300B.

Regarding the piezoelectric elements 300B having the above structure, each piezoelectric material layer 70B is covered with the second electrode 80B. In particular, since the piezoelectric material layer 70B between adjacent first electrodes 60A is covered with the second electrode 80B, the piezoelectric material layer 70B can be protected from ambient moisture or the like by the second electrode 80B even when a protection film having moisture resistance is not provided on the piezoelectric elements 300B. With this configuration, it is possible to prevent lowering of the displacement amount of the piezoelectric element 300B which may occur when a protection film is provided thereon. Namely, by obviating the need of a protection film, it is possible to suppress the cost and to realize the piezoelectric element 300B superior in a displacement characteristic.

In addition, since the first electrode 60A is made to be each of the discrete electrodes of the plurality of piezoelectric elements 300B, it is possible to facilitate the application of a voltage from the first electrode 60A toward the second electrode 80B as described in the second embodiment of the invention described above.

Other Embodiments

While several embodiments of the invention are described above, the invention is not limited to the examples described herein. In the above first embodiment, while a silicon monocrystalline substrate is exemplarily used as the fluid channel forming substrate 10, is the invention is not so limited. For example, a silicon monocrystalline substrate having a (100) crystal orientation or a (110) crystal orientation, an SOI substrate or a material such as glass can be used.

In the above described ink jet recorder II, while the ink jet head I (the head units 1A and 1B) that is mounted on the carriage 3 and is moved in the sub-scanning direction is exemplarily shown, the invention is not limited thereto. The invention can be applied to a so-called line type printer in which, for example, the ink jet recording head I is fixed and printing is performed by moving only a recording sheet S such as paper in the sub-scanning direction.

While the ink jet recording head is described as one example of the liquid ejecting head in the above first embodiment, the invention can be widely applied to a variety of liquid ejecting heads so that the invention can be applied to a liquid ejecting head that ejects liquid other than ink. As any other liquid ejecting heads, for example, various kinds of recording heads used in image recorders such as printers, a colorant ejecting head used for manufacturing a color filter of a liquid crystal display, an electrode material ejecting head used for forming an electrode of an organic EL display or an FED (field emission display), and a biological organic material ejecting for manufacturing a bio-chip may also be used.

The invention can be applied to not only the actuator device mounted on the liquid ejecting head, as a representative of the ink jet recording heads, but also an actuator device to be mounted on any other devices.

What is claimed is:

1. A liquid ejecting head comprising:
a pressure generating chamber formed therein which communicates with a nozzle opening; and
a piezoelectric element having,
a first electrode,
a piezoelectric material layer formed above the first electrode and having a perovskite structure, and
a second electrode formed above the piezoelectric material layer,
wherein the piezoelectric material layer has a monoclinic structure, the piezoelectric material layer having a polarization moment in a first direction, an angle θa being formed between an electric field direction of an electric field generated between the first electrode and the second electrode and the first direction, and
wherein the angle θa is greater than an angle $\theta_0$ formed between the electric field direction and a second direction of the polarization moment of the piezoelectric material layer, different from the first direction, when a piezoelectric constant ($d_{31}$) of the piezoelectric material layer reaches a local maximum level.

2. The liquid ejecting head according to claim 1, wherein the angle θa is greater than the angle $\theta_0$ by 3 or more degrees.

3. The liquid ejecting head according to claim 1, wherein the piezoelectric material layer includes lead, zirconium and titanium.

4. The liquid ejecting head according to claim 1, wherein a crystal of the piezoelectric material layer is oriented to a (100) plane.

5. The liquid ejecting head according to claim 1, wherein the electric field generated between the first electrode and the second electrode is directed from the first electrode to the second electrode.

6. The liquid ejecting head according to claim 1, wherein a displacement amount of the piezoelectric material layer increases in accordance with increase of the number of repetitions of application of the electric field.

7. The liquid ejecting head according to claim 6, wherein the displacement amount of the piezoelectric material layer increases in accordance with increase of the number of repetitions of application of the electric field, and then subsequently decreases.

8. A liquid ejecting apparatus comprising:
the liquid ejecting head according to claim 1; and
a driving unit that applies a voltage across the first electrode and the second electrode.

9. An actuator device comprising:
a first electrode;
a piezoelectric material layer formed above the first electrode and having a perovskite structure; and
a second electrode formed above the piezoelectric material layer,
wherein the piezoelectric material layer has a monoclinic structure, the piezoelectric material layer having a polarization moment in a first direction, an angle θa being formed between an electric field direction of an electric field generated between the first electrode and the second electrode and the first direction, and
wherein the angle θa is greater than an angle $θ_0$ formed between the electric field direction and the orientation of the polarization moment of the piezoelectric material layer, different form the first direction, when a piezoelectric constant ($d_{31}$) of the piezoelectric material layer reaches a local maximum level.

10. A liquid ejecting apparatus comprising:
a liquid ejecting head including:
a fluid channel forming substrate having a pressure generating chamber formed therein which communicates with a nozzle opening that ejects a liquid droplet; and
a piezoelectric element having, a first electrode, a piezoelectric material layer that is provided on the first electrode, the piezoelectric material layer having a perovskite structure indicated by a general formula: $ABO_3$, and a second electrode formed on the piezoelectric material layer opposite to the first electrode; and
and a driving unit that applies a voltage across the first electrode and the second electrode so as to generate an electric field in a predetermined direction to the piezoelectric element so as to drive the liquid ejecting head,
wherein the piezoelectric material layer has a monoclinic structure, and the piezoelectric material layer is configured with a polarization moment in a first direction, an angle θa being formed between an electric field direction of an electric field generated between the first electrode and the second electrode and the first direction, and the angle θa is greater than an angle $θ_0$ formed between the electric field direction and a second direction of the polarization moment of the piezoelectric material layer, different form the first direction, when a piezoelectric constant ($d_{31}$) of the piezoelectric material layer reaches a maximum level, and
wherein a displacement amount of the piezoelectric material layer increases in accordance with an increase in the number of times the driving unit drives the liquid ejecting head.

11. The liquid ejecting head according to claim 10, wherein the angle θa is greater than the angle $θ_0$ by 3 or more degrees.

12. The liquid ejecting apparatus according to claim 10, wherein the piezoelectric material layer includes lead, zirconium and titanium.

13. The liquid ejecting apparatus according to claim 10, wherein a crystal of the piezoelectric material layer is oriented to a (100) plane.

14. The liquid ejecting apparatus according to claim 10, wherein the electric field generated between the first electrode and the second electrode is directed from the first electrode to the second electrode.

15. The liquid ejecting apparatus according to claim 10, wherein the displacement amount of the piezoelectric material layer subsequently decreases after increasing.

16. The liquid ejecting apparatus according to claim 10, wherein the perovskite structure includes a ground layer, the ground layer including lanthanum nickel oxide.

* * * * *